United States Patent [19]
Tsunekawa et al.

[11] Patent Number: 5,478,401
[45] Date of Patent: Dec. 26, 1995

[54] APPARATUS AND METHOD FOR SURFACE TREATMENT

[75] Inventors: Sukeyoshi Tsunekawa, Tokorozawa; Keisuke Funatsu, Hamura; Kenichi Kawasumi, Ome; Akio Inada, Hinode; Masaro Kaku, Samukawa, all of Japan

[73] Assignee: Hitachi, Ltd., Tokyo, Japan

[21] Appl. No.: 399,512

[22] Filed: Mar. 7, 1995

[30] Foreign Application Priority Data

Mar. 10, 1994 [JP] Japan ................................. 6-039418

[51] Int. Cl.$^6$ ................................................ H01L 21/302
[52] U.S. Cl. .................... 134/1; 216/66; 156/345
[58] Field of Search .................. 134/1; 216/66; 156/345

[56] References Cited

FOREIGN PATENT DOCUMENTS 6-132266  5/1994  Japan .
6-267909  9/1994  Japan .

*Primary Examiner*—Richard Bueker
*Attorney, Agent, or Firm*—Antonelli, Terry, Stout & Kraus

[57] ABSTRACT

An apparatus and method for surface treatment of a substance to be processed, which are capable of decreasing the number of foreign matters holding on the reverse side of the substance more than prior art like apparatus and method without largely decreasing a surface treating speed as compared with that of the prior art, by supplying ozone gas to the surface of the substance mounted on a supporting base. The supporting base has a heating part and a supporting part. There is provided a supporting material on the surface of the supporting part for partly supporting one side of the substance to be processed so that a required amount of gap may be formed between the substance to be processed and the supporting part. In the heating part is built a heater. And for a member constituting the supporting part is used a material having greater emissivity than a member constituting the heating part.

16 Claims, 5 Drawing Sheets

APPARATUS AND METHOD FOR SURFACE TREATMENT

BACKGROUND OF THE INVENTION

The present invention relates to an apparatus and method for surface treatment of a substance, such as a semiconductor wafer, to be processed by the use of ozone gas and ultraviolet light or by the use of ozone gas. Particularly, the present invention is best suited for removing a patterned resist formed on the surface of the semiconductor wafer.

FIG. 1 shows a sectional view of a prior art apparatus for surface treatment. In this apparatus, a substance 1 to be treated, for example a semiconductor wafer, is placed on a stage 30; and with a 0.2 mm to 1.0 mm gap provided between a nozzle plate 5 and the substance 1 to be treated, an ozone gas is fed from a nozzle 6 into the gap, thereby ashing and removing an organic substance such as a resist from the surface of the substance being treated. An electric heater 40 is built in the stage 30. The stage 30 is heated by supplying the current to the electric heater 40, and accordingly the substance 1 to be treated on the stage 30 is heated to increase the temperature of the resist to accelerate ashing treatment. Vacuum suction of the semiconductor wafer 1 is effected by evacuating a communicating hole through a vacuum port 4. An evacuation port 8 serves to form a stream of ozone gas in a treating space where the substance 1 to be treated is present and to evacuate an unnecessary gas generated within the space. An ultraviolet light source 7 is generally an ultraviolet lamp, and is used for surface treatment in cooperation with the ozone gas. If the ultraviolet light is applied during surface treatment, the surface treatment speed will sometimes gets higher than the surface treatment using the ozone gas alone. This apparatus for surface treatment may be either provided or not provided with the ultraviolet light source 7. Even when the apparatus is provided with the ultraviolet light source 7, whether or not the light source 7 is used during the surface treatment is arbitrary.

In the surface treatment apparatus, the substance 1 to be treated is mounted on the stage 30. The entire surface of one face of the substance 1 to be treated is in contact with the surface of the stage 30. When the surface treatment is performed in this condition, a number of foreign matters are likely to attach on this one face of the substance 1 to be treated. In the case the substance 1 is a semiconductor wafer, the one face is a face on which no device is formed, that is, the reverse side of the substance 1. The foreign matters go around to the other face of the substance being treated, that is, the face on which the devices are formed in the case of the semiconductor wafer, in the subsequent process for surface treatment, often presenting an obstacle to the subsequent surface treatment. It is because that there is a more and more increasing demand for finer sizes of device and wiring patterns formed on the surface of the substance 1 with the development of higher integrated circuits for semiconductor devices, and because that, in the following surface treatment process, the presence of the foreign matters will become a cause of defects of the substance to be processed for semiconductor devices, etc. in the event that foreign matters are present on a fine pattern. The foreign matters, if metallic ones of substantially minute sizes, will enter the device region, presenting such a vital problem as the deterioration of device characteristics. This also is because the device sensitivity has increased owing to the adoption of fine devices, and accordingly entrance of slight foreign matters gives an adverse effect to the electric characteristics of the devices and so forth.

SUMMARY OF THE INVENTION

It is an object of the present invention to provide an apparatus and method for treating the surface of a substance to be processed which is capable of decreasing the number of foreign matters attaching on the reverse side of the substance more than that in the case of a conventional substance to be processed, without largely lowering a surface treating speed as compared with that in prior art apparatus.

In the present invention, therefore, the present invention provides an apparatus for surface treatment of the substance to be processed, by supplying an ozone gas to the surface of the substance on a supporting base; the supporting base has a heating part and a supporting part; there is provided a supporting material on the surface of the supporting part for partly supporting one face of the substance to be processed so that a specific gap may be formed between the substance to be processed and the supporting part; in the heating part is built a heater; and for a member constituting the supporting part is used a material having greater emissivity than the member constituting the heating part.

In the method for surface treatment pertaining to the present invention, there are prepared a supporting base having a heating part with a built-in heater and a supporting part, a supporting material placed on the surface of the supporting part for partially supporting one side of the substance to be processed, to form a specific amount of gap between the substance to be processed which is set on the supporting base and the supporting part; on the supporting part is placed the substance to be processed; and then the ozone gas is supplied to the surface of the substance placed for surface treatment on the supporting part.

In the present invention, there is provided a gap between the substance to be processed and the supporting part. In other words, the substance to be processed is not held in face contact with the supporting base but is close to a form of point contact, whereby the probability of attachment of foreign matters can be lessened.

Furthermore, according to the present invention also, the substance to be processed is heated in the process of surface treatment for the purpose of increasing the surface treating speed. However, in the constitution of the present invention, the contact surface area of the supporting base and the substance to be processed is smaller than that in a prior art. In this case, therefore, it is possible to reduce the number of foreign matters which attach on the substance surface, but at the same time the surface treating speed decreases lower than the prior art. In the present invention, the supporting part of the supporting base and the heating part are built separately, and a material having greater emissivity than the material constituting the heating part is used to constitute the supporting part. In the heating part is built a heater, for which the use of an electric heater inserted in a space provided in a member of the heating part is considered. In this case, a heat source is unevenly distributed within the heating part, and accordingly not the entire part of the electric heating part is heated. It is, therefore, desirable to use a material of high thermal conductivity to constitute the heating part for the purpose of as high efficient heat transmission from the heater to the substance to be processed. However, the material of high thermal conductivity has generally a relatively small value of emissivity. It is hard to find a material having both the high thermal conductivity and the high emissivity. In general, both of these physical properties are contrary to each other. Therefore the heating part is composed of a material of relatively high thermal conductivity, while the supporting part is made of a material of relatively high emissivity. Since the supporting part has relatively high emissivity, the heat energy transmitted from the heating part to the supporting part passes via the gap between the supporting part and the substance being processed, to thereby efficiently heat the substance being processed.

A preferable material for constituting the heating part is aluminum. Metals generally have relatively high thermal conductivity. For constituting the supporting part, the use of an insulating material, such as quartz glass, is preferable. The insulating material generally has relatively higher emissivity than the metal.

The present inventor et al., in producing the present invention, noticed that the thermal flux caused by radiation can be expressed by the following equation and that the value of the thermal flux and the value of emissivity are proportional to each other.

Thermal flux by radiation $=\epsilon\sigma(T_2^4-T_1^4)$
where $\epsilon$: the emissivity of supporting mechanism part $\sigma$: the Stefan Boltzmann constant $T_1$: the temperature of a substance to be processed $T_2$: the temperature of a supporting mechanism part The foregoing object and other objects of the present invention will become more apparent and understandable from the following detailed description thereof, when read in connection with the accompanying drawings.

DETAILED DESCRIPTION OF THE PREFERRED EMBODIMENT

Hereinafter the embodiments of the present invention will be explained with reference to the accompanying drawings.

First Embodiment

Figure 2A:
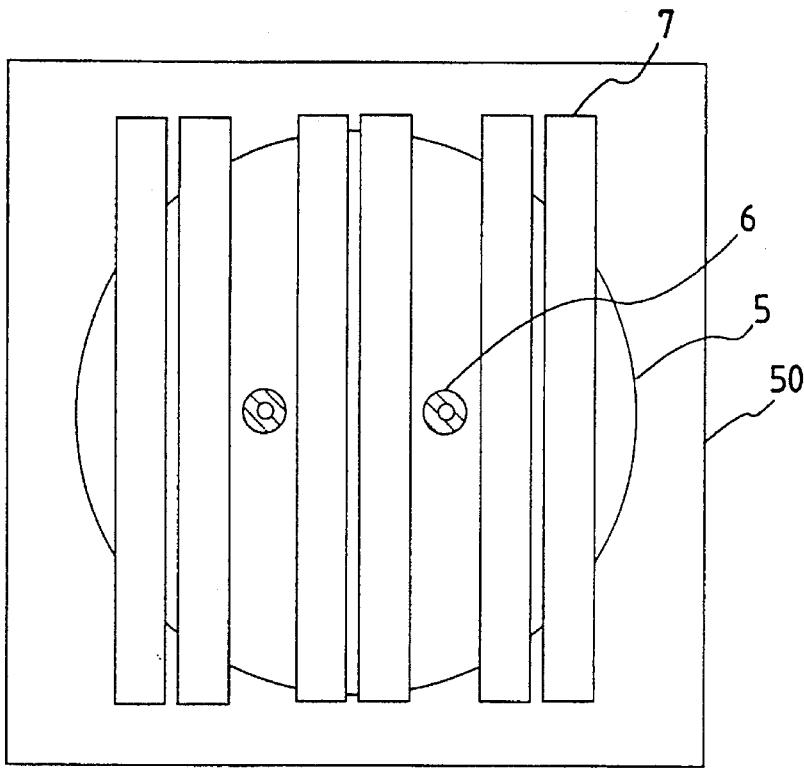
Figure 2B:
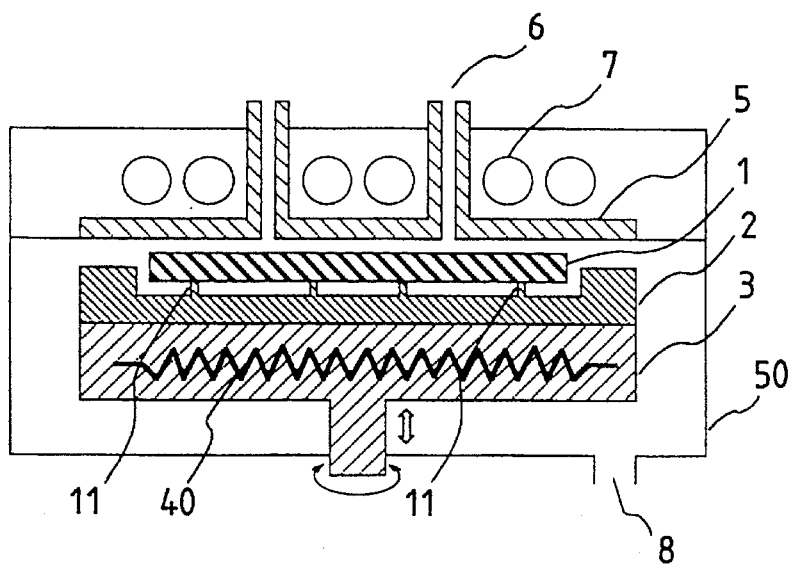

FIGS. 2A and 2B are views showing a first embodiment of an apparatus for surface treatment according to the present invention; FIG. 2A shows a front schematic view and FIG. 2B shows a schematic sectional view. The apparatus for surface treatment, as shown in these drawings, is provided with a heating mechanism part 3 and a supporting mechanism part 2 mounted in close contact with the heating mechanism part 3, which are arranged in order of mention from below within a vessel 50; and on the upper surface of the supporting mechanism part 2 are formed a plurality of projections 11 for loading the substance 1 to be processed. The height of the projections 11, that is, a gap between the reverse side of the substance 1 to be processed and the supporting mechanism part 2, is set within a range of 0.1 to 0.5 mm. The supporting mechanism part 2 and the heating mechanism part 3 are of a disc type and are provided with an up-and-down drive mechanism (not illustrated) so that these mechanism parts can rotate and move up and down like arrow marks. In the upper part in the vessel 50 is provided the nozzle 6 for supplying ozone to the lower part in the vessel 50, and the lower part of the nozzle 6 opens to the surface of the substance 1 to be processed. At the lower side of the nozzle 6 is provided the nozzle plate 5 which serves also as a partition. A gap between the underside of the nozzle plate 5 and the upper surface of the substance 1 to be processed can be adjusted to a desired value within a range of from 0.2 mm to 1.0 mm by means the up-and-down drive mechanism of the heating mechanism part 3. In the upper part of the vessel 50 are disposed a plurality of ultraviolet lamps 7 which apply the ultraviolet light, as required, to the substance 1 to be processed. The nozzle plate 5 is produced of an ultraviolet-ray transmitting material such as a synthetic quartz.

Surface treatment for cleaning the substance 1 to be processed by the above-described apparatus for surface treatment is performed as follows. First, the supporting mechanism part 2 is moved downwardly by the up-and-down drive mechanism (not illustrated) of the heating mechanism part 3 (the heating heater is not shown), and the substance 1 to be processed is loaded by a transfer arm (not illustrated) on the supporting mechanism part 1 with a 0.1 mm to 0.5 mm gap provided. Subsequently, the gap between the substance 1 to be processed and the nozzle plate 5 is adjusted to a desired value within the range of 0.2 mm to 1.0 mm by means of the up-and-down drive mechanism of the heating mechanism part 3. Then ozone is supplied at the nozzle 6 and the heating mechanism part 3 is driven to rotate, performing the treatment. Unnecessary organic matters holding on the surface of the substance being processed react with ozone to turn to a $CO_2$ gas and water vapor, being discharged at the exhaust port 8. Radiating the ultraviolet light to the substance to be processed from the ultraviolet lamp 7 as occasion demands accelerates the reaction of the ozone with the organic matters.

Mounting the substance 1 to be processed on the supporting mechanism part 2 with a gap defined by the projections 11 has decreased the number of foreign matters attaching on the reverse side of the substance 1 to be processed, correspondingly to the rate of decrease of the contact surface area. Also, when there is provided a 0.2 mm gap at either of the upper and lower sides of the substance 1 to be processed, the speed for removing organic matters from the surface of the substance under processing is nearly equal to the prior art apparatus secured by vacuum suction to the supporting mechanism part 2. This is considered due to the efficient heating of the substance 1 because of the use, in the supporting mechanism part, of a material (quartz) of a greater emissivity than that of a material (aluminum) of the heating mechanism part 3. Also, the optimum amount of gap to be formed between the supporting mechanism part 2 and the substance 1 to be processed is 0.1 mm to 0.5 mm. Decreasing the gap below 0.1 mm makes it easy to transfer foreign substances from the supporting mechanism part 2 to the reverse side of the substance 1 under processing. On the contrary, when the gap is over 0.5 mm, thermal conduction from the supporting mechanism part 2 to the substance 1 to be processed decreases remarkably.

Second Embodiment

Figure 1:
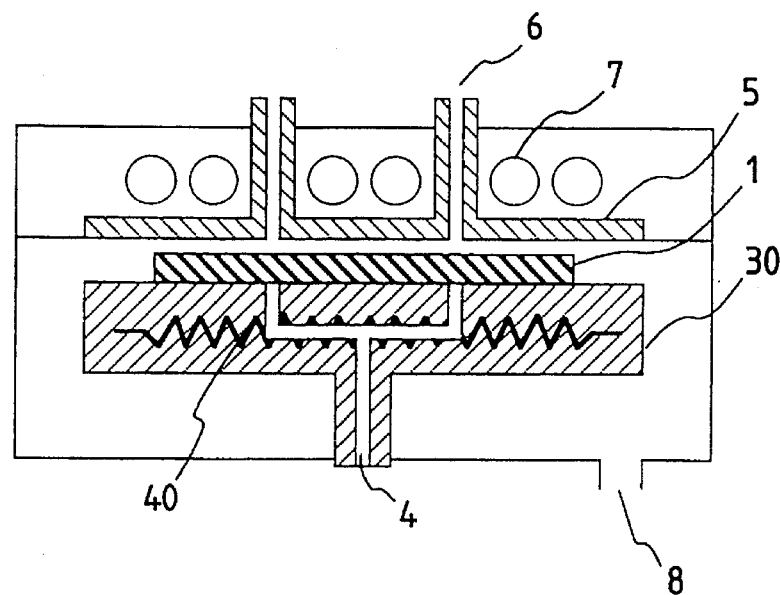
FIG. 1 is a view showing a prior art apparatus for surface treatment.
Figure 3:
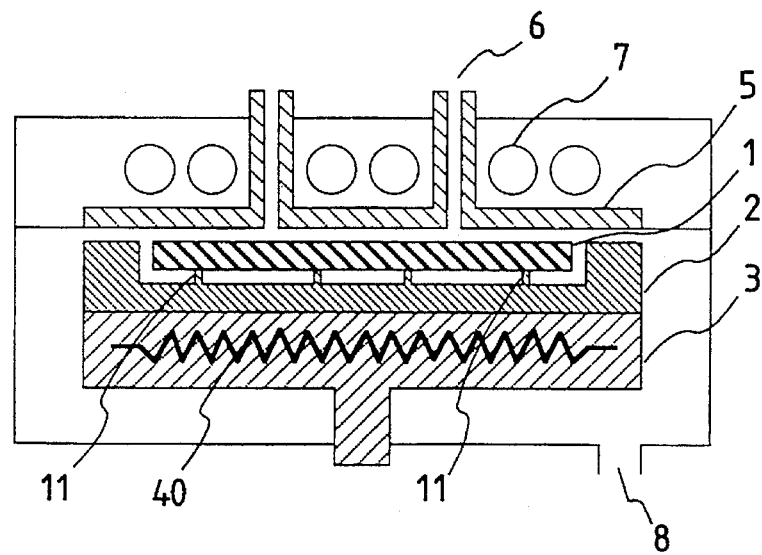
FIGS. 2 to 6 are views each showing an apparatus for surface treatment according to embodiments of the present invention.

FIG. 3 shows the schematic sectional view of a second embodiment of the apparatus for surface treatment according to the present invention. In the present embodiment, the peripheral surface height of the supporting mechanism part 2 is made equal to upper surface of the substance 1 to be processed; other parts are substantially the same as the first embodiment. The same component parts are designated by the same reference numerals and are not described in this embodiment and in the following embodiments as well. In the present embodiment, the uniformity of the organic matter removing speed could be improved 5 to 10 percent as compared with the first embodiment. This is considered to be due to the uniform flow of the ozone gas around the substance being processed. In the case of the substance 1 of standardized thickness, when a specific substance is to be processed, the peripheral surface height of the supporting mechanism part 2 can be effectively fixed as previously stated.

Third Embodiment

Figure 4:
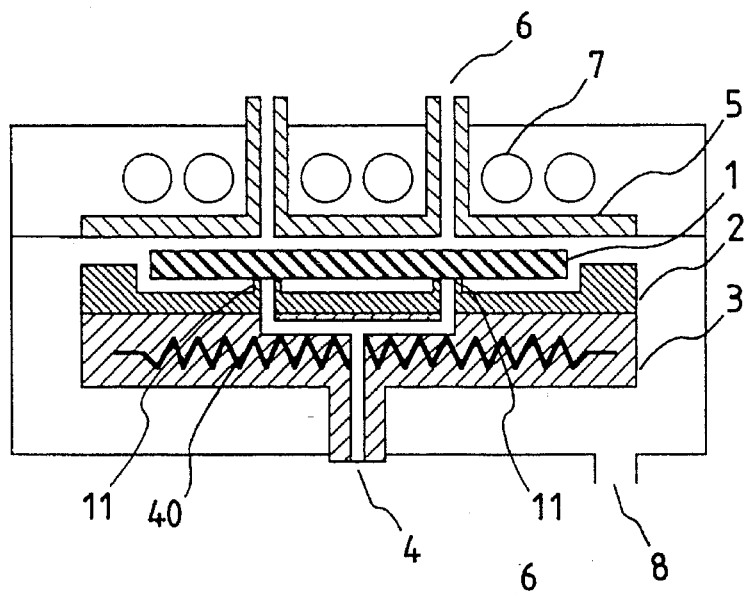

FIG. 4 shows a schematic sectional view of a third embodiment of the apparatus for surface treatment according to the present invention. In the present embodiment, the projections 11 are constituted of vacuum pipes. Since the substance 1 to be processed is sucked with vacuum at the vacuum port 4, surface treatment can be performed similarly to that in the prior art apparatus even when the substance 1 to be processed is warped.

Fourth Embodiment

Figure 5:
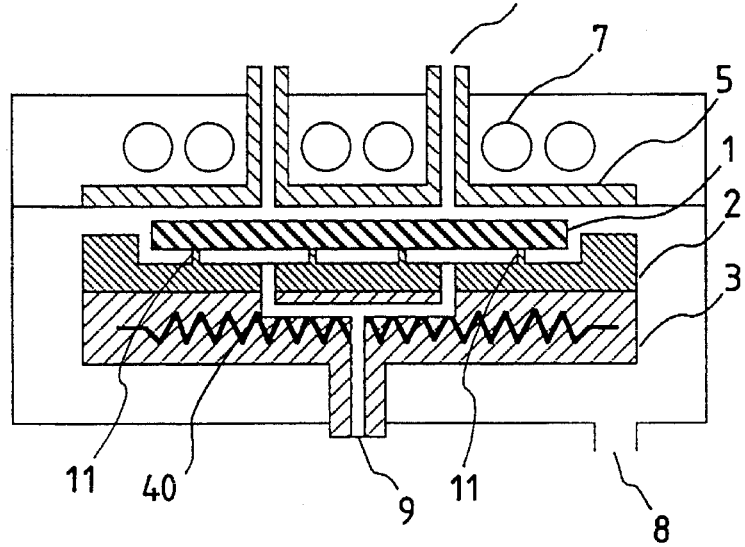

FIG. 5 shows a schematic sectional view of a fourth embodiment of the apparatus for surface treatment according to the present invention. In the present embodiment, another gas supply port 9 is provided on the reverse side of the substance to be processed in addition to the nozzle 6 provided in the first embodiment. According to the present embodiment, there is routed a pipe connected to the gas supply port 9, in the supporting mechanism part 2 and the heating mechanism part 3, to thereby supply the ozone gas. Ozone decomposition by the ultraviolet rays applied from the ultraviolet lamp 7 can not be expected, but ozone is decomposed by heat radiation from the supporting mechanism part 3, ensuring efficient removal of organic matters from the reverse side of the substance to be processed. Particularly it is effective for removal of the organic matters from the side face of the substance to be processed such as a silicon wafer.

Fifth Embodiment

Figure 6:
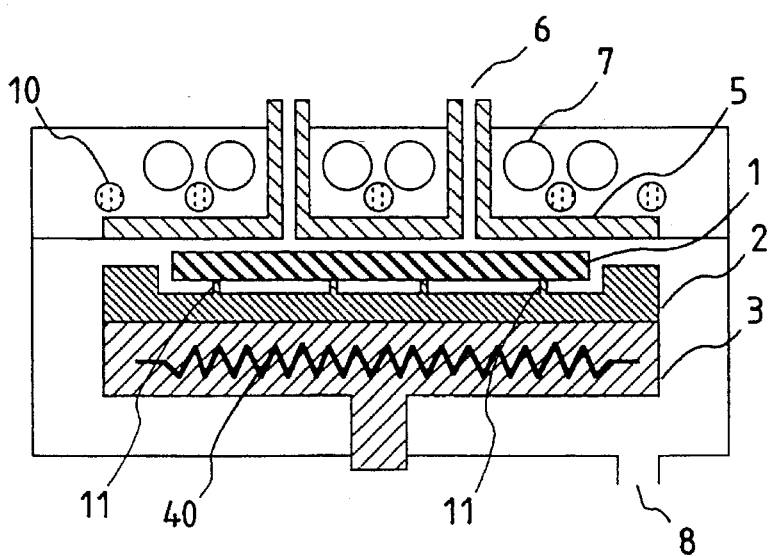

FIG. 6 shows a schematic sectional view of a fifth embodiment of the apparatus for surface treatment according to the present invention. In the present embodiment, an infrared lamp 10 is added to the first embodiment to heat the substance 1 to be processed also from the surface. The infrared lamp 10 has an effect to heat the substance 1 to be processed from the reverse side and besides can directly heat organic matters such as resist holding on the surface of the substance 1 to be processed. Furthermore, the non-uniformity of temperature can be compensated for by increasing the electric power of the infrared lamp 10 around the substance 1 to be processed more than that at the center; the electric power of the lamp 10 can be changed to programmable one in relation to the time of processing; and furthermore its result is quickly reflected in the temperature of the substance to be processed. A similar effect is obtainable by using a heating heater in place of the infrared lamp 10.

Sixth Embodiment

Figure 7A:
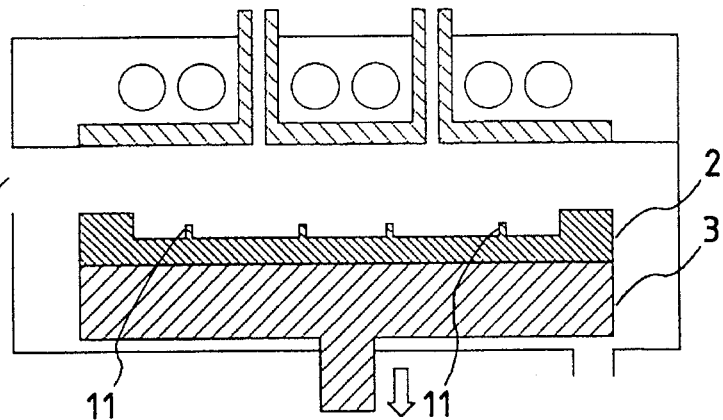
FIGS. 7A to 7H are typical sectional views of a sixth embodiment of a surface treating method according to the present invention.
Figure 7B:
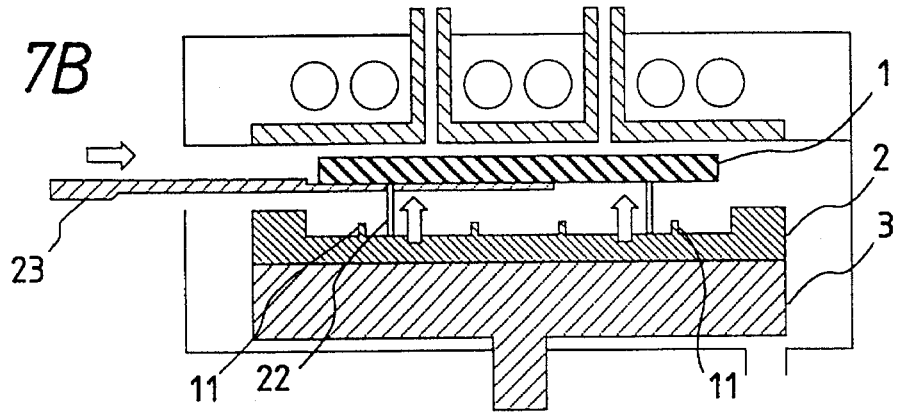
Figure 7C:
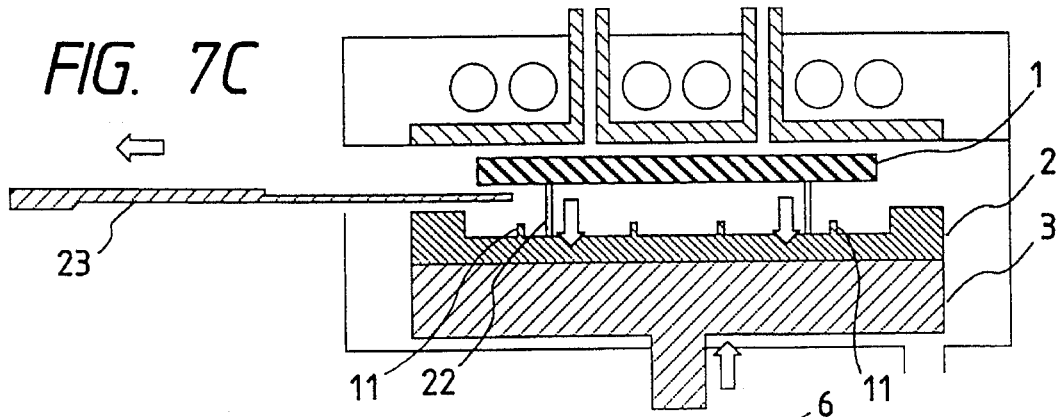
Figure 7D:
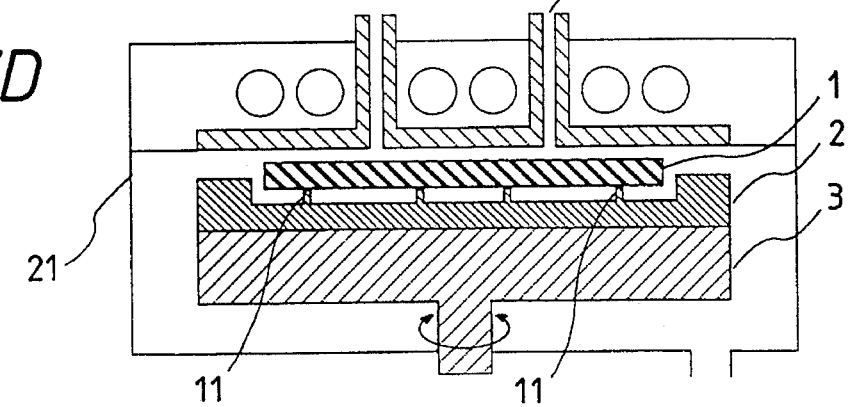
Figure 7E:
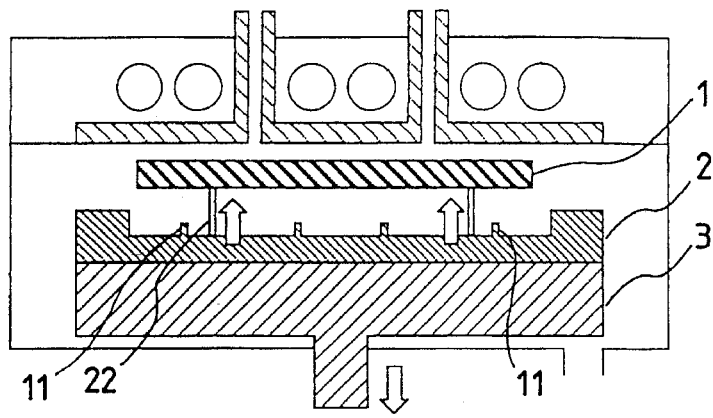
Figure 7F:
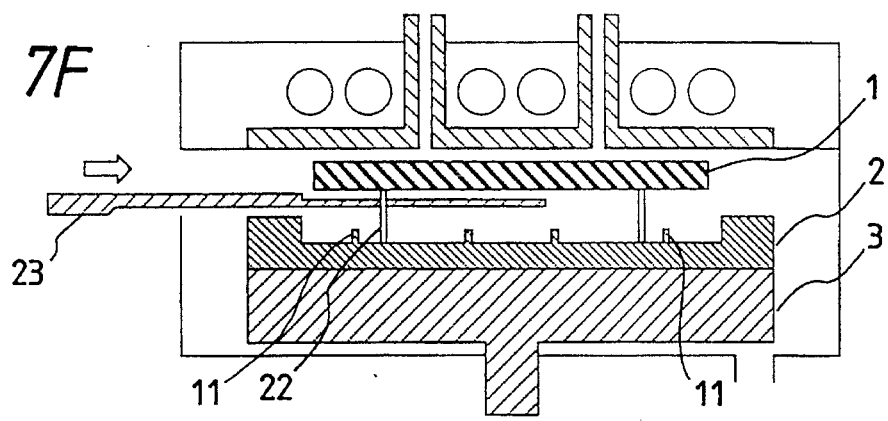
Figure 7G:
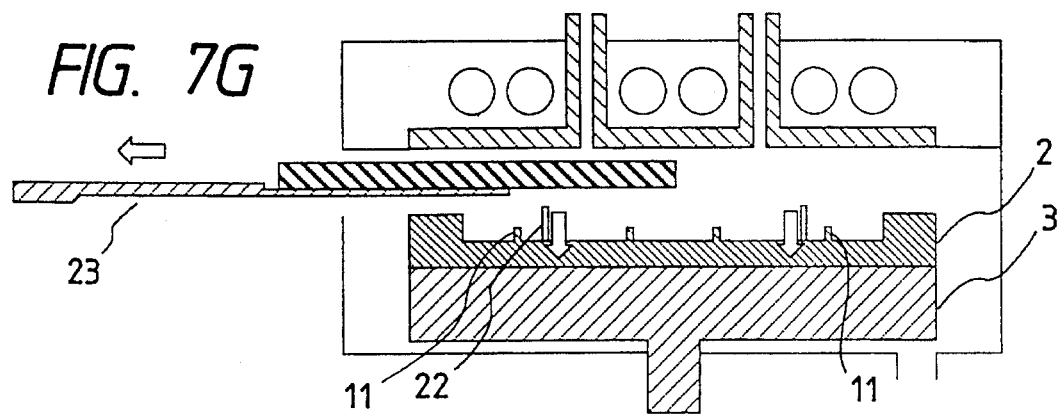
Figure 7H:
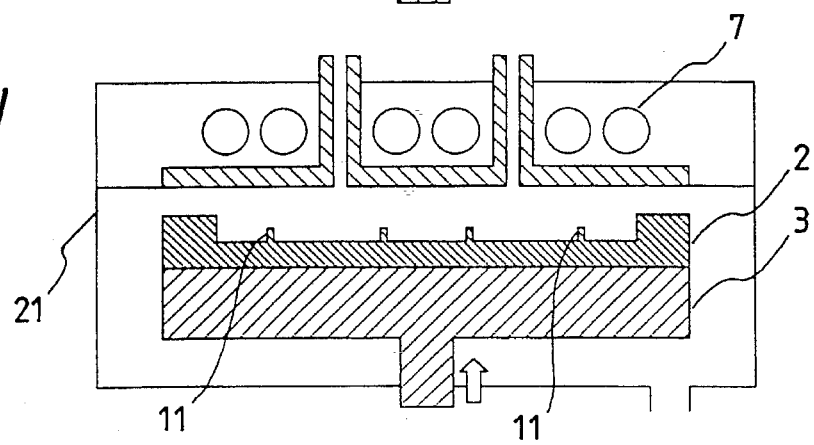

FIGS. 7A to 7H show schematic sectional view of a sixth embodiment of the method for surface treatment according to the present invention, which will be explained by referring to these drawings. First, the substance 1 to be processed is brought into the vessel in the following manner. A shutter 21 opens and the supporting mechanism part 2 and the heating mechanism part 3 move downwardly. As shown in FIG. 7A, the substance 1 to be processed which is loaded on the arm 23 is carried into the vessel 50, and is transferred onto up-down pins 22 that have risen as shown in FIG. 7B. The arm 23 withdraws out of the vessel as shown in FIG. 7C and the shutter 21 closes; and at the same time the up-down pins 22 go down until the substance to be processed is placed on the projections 11 of the supporting mechanism part 2 as shown in FIG. 7D. Subsequently, the ozone gas is emitted against the substance to be processed, from the nozzle 6 for a specific period of time, to thereby process the substance to be processed which rotates together with the heating mechanism part and the supporting mechanism part. After the completion of this treatment, the substance thus processed is carried out as described below. The supporting mechanism part 2 and the heating mechanism part 3 go downwardly while the up-down pins 22 move upwardly as shown in FIG. 7E. The shutter opens and the arm 23 is inserted to transfer the substance to be processed to the arm as shown in FIG. 7F. Then the substance 1 to be processed is brought out of the vessel and the shutter closes as shown in FIG. 7G. The contact surface area of the substance 1 to be processed and the arm 23 is decreased as much as possible. The ultraviolet lamp 7 is turned on as occasion calls. This method enables to diminish the number of foreign substances holding on the reverse side of the substance 1 to be processed in accordance with a decrease in the contact surface area. The removal of the supporting mechanism part 2 can be done easier than the heating mechanism part 3; and furthermore the number of foreign substances can be reduced by regularly washing the supporting mechanism part.

According to the present embodiments of the present invention, the transfer of foreign matters by contact can lessen the foreign matters in accordance with the ratio of decrease of the contact surface area. In the present embodiment, quarts is used in the supporting mechanism part 2; however, it has been confirmed that a similar effect is obtainable when there is adopted a material having a greater emissivity than aluminum used in the heating mechanism part 3. That is, the substance to be processed cab be heated effectively by the use, for the supporting mechanism part 2, of a material of greater emissivity than the material of the heating mechanism part 3, thereby enabling efficient removal of organic matters from the surface of the substance to be processed. The supporting mechanism part 2 can easily be installed and removed, and also can be washed efficiently.

According to the present invention, it is possible to provide an apparatus and method for surface treatment which is capable of decreasing the number of foreign matters on the reverse side of the substance to be processed more than that in prior art apparatus, without largely decreasing the surface treating speed.

What is claimed is:

1. An apparatus for surface treatment of a substance to be processed which is mounted on a supporting base, by supplying ozone gas to the surface of said substance to be processed, wherein said supporting base has a heating part and a supporting part, a supporting material for partially supporting one side of said substance to be processed is mounted on the surface of said supporting part so that there will be formed a specific amount of gap between said substance to be processed and said supporting part, a heater is built in said heating part, and said supporting part is constituted of a material having a greater emissivity than said heating part.

2. An apparatus for surface treatment of a substance to be processed as claimed in claim 1, wherein said surface treatment is for removing a resist film formed on the surface of said substance to be processed or for oxidizing the surface of an aluminum wiring patterned on the surface of said substance to be processed.

3. An apparatus for surface treatment of a substance to be processed as claimed in claim 1, wherein said surface treatment includes a surface cleaning treatment or a surface oxidation treatment of said substance to be processed.

4. An apparatus for surface treatment of a substance to be processed as claimed in claim 1, wherein one side of said heating part and one side of said supporting part are fixed in face contact.

5. An apparatus for surface treatment of a substance to be processed as claimed in claim 1, wherein said heater is for heating said substance to be processed, via a gap between said heating part and said supporting part and between said supporting part and said substance to be processed, by heating during said surface treatment.

6. An apparatus for surface treatment of a substance to be processed as claimed in claim 1, wherein said supporting material is formed integrally with said supporting part.

7. An apparatus for surface treatment of a substance to be processed as claimed in claim 1, wherein a material constituting said supporting part has a less thermal conductivity than a material constituting said heating part.

8. An apparatus for surface treatment of a substance to be processed as claimed in claim 1, wherein there are used a plurality of supporting materials stated above, each of which has a form of projection, and said one side of said substance to be processed is supported by tips of said supporting materials.

9. An apparatus for surface treatment of a substance to be processed as claimed in claim 1, having a means for disposing a plane surface adjacent to the surface of said substance to be processed and separated therefrom so as to create a narrow gap between said plane surface and the surface of said substance to be processed.

10. An apparatus for surface treatment of a substance to be processed as claimed in claim 1, wherein at least one of ultraviolet light source, infrared light source and heater is disposed in a position above the surface of said substance to be processed.

11. An apparatus for surface treatment of a substance to be processed as claimed in claim 1, wherein the size of said gap should be 0.1 mm or more and 0.5 mm or less.

12. An apparatus for surface treatment of a substance to be processed as claimed in claim 1, wherein a concave surface is formed in said supporting part and in said concave surface is disposed said supporting material; and said substance to be processed, when set in said concave surface, is supported by said supporting material, and said concave surface and said supporting material are so constituted that the surface of said substance to be processed thus set and a peripheral part of said concave surface of said supporting material will be substantially flush with each other.

13. An apparatus for surface treatment of a substance to be processed as claimed in claim 1, wherein said supporting material is provided with a vacuum port for sucking with vacuum said substance to be processed.

14. An apparatus for surface treatment of a substance to be processed as claimed in claim 1, having a means in said gap for supplying ozone gas.

15. An apparatus for surface treatment of a substance to be processed as claimed in claim 1, wherein said supporting material and said supporting part are produced of different materials, and the material constituting said supporting material has a greater emissivity than the material constituting said supporting part.

16. A method for surface treatment of a substance to be processed, which is for preparing a surface treating apparatus using a supporting base having a heating part with a built-in heater and a supporting part, and a supporting material for partially supporting one side of said substance to be processed so as to form a specific amount of gap between said substance mounted on said supporting base and said supporting part, and mounted on the surface of said supporting part;

said supporting part being constituted of a material having a greater emissivity than a material of said heating part;

said substance to be processed being set on said supporting part; and ozone gas being supplied to the surface of said substance to be processed set on said supporting part.

* * * * *